US010818573B2

(12) United States Patent
Tsuyuno et al.

(10) Patent No.: US 10,818,573 B2
(45) Date of Patent: Oct. 27, 2020

(54) POWER SEMICONDUCTOR MODULE WITH HEAT DISSIPATION PLATE

(71) Applicant: Hitachi Automotive Systems, Ltd., Hitachinaka-shi, Ibaraki (JP)

(72) Inventors: Nobutake Tsuyuno, Tokyo (JP); Takeshi Tokuyama, Hitachinaka (JP); Eiichi Ide, Tokyo (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 15/753,763

(22) PCT Filed: Aug. 26, 2015

(86) PCT No.: PCT/JP2015/073926
§ 371 (c)(1),
(2) Date: Feb. 20, 2018

(87) PCT Pub. No.: WO2017/033295
PCT Pub. Date: Mar. 2, 2017

(65) Prior Publication Data
US 2018/0254235 A1    Sep. 6, 2018

(51) Int. Cl.
*H01L 25/00* (2006.01)
*H01L 23/367* (2006.01)
(Continued)

(52) U.S. Cl.
CPC ........ *H01L 23/3675* (2013.01); *H01L 21/565* (2013.01); *H01L 23/041* (2013.01);
(Continued)

(58) Field of Classification Search
CPC ... H01L 23/3675; H01L 23/29; H01L 23/473; H01L 25/18; H01L 25/50
See application file for complete search history.

(56) References Cited

U.S. PATENT DOCUMENTS 9,277,682 B2 *    3/2016   Kaneko .................. H01L 23/473
9,466,550 B2 *   10/2016   Luan ...................... H01L 21/561
(Continued)

FOREIGN PATENT DOCUMENTS

JP    10-112519 A      4/1998
JP    2004-303900 A   10/2004
(Continued)

OTHER PUBLICATIONS

International Search Report (PCT/ISA/210) issued in PCT Application No. PCT/JP2015/073926 dated Nov. 10, 2015 with English translation (Four (4) pages).
(Continued)

*Primary Examiner* — Hoa B Trinh
(74) *Attorney, Agent, or Firm* — Crowell & Moring LLP

(57) ABSTRACT

An object of the present invention is to provide a structure, particularly, a power semiconductor module, which suppresses a bypass flow of a cooling medium and improves cooling efficiency. A structure according to the present invention includes a heat dissipation plate thermally connected to a heating element, and a resin region having a resin material that fixes the heating element and the heat dissipation plate, wherein the heat dissipation plate includes a fin portion including a plurality of fins protruding from a heat dissipation surface of the heat dissipation plate and formed to be exposed from the sealing resin material, and a wall portion formed to protrude from the heat dissipation surface to a same side as the fin and which separates the fin portion and the resin region.

11 Claims, 17 Drawing Sheets

(51) Int. Cl.
  *H01L 23/29* (2006.01)
  *H01L 25/18* (2006.01)
  *H01L 21/56* (2006.01)
  *H01L 23/433* (2006.01)
  *H01L 23/24* (2006.01)
  *H01L 25/07* (2006.01)
  *H01L 23/31* (2006.01)
  *H01L 23/04* (2006.01)
  *H01L 23/473* (2006.01)

(52) U.S. Cl.
  CPC .............. *H01L 23/24* (2013.01); *H01L 23/29* (2013.01); *H01L 23/3121* (2013.01); *H01L 23/4334* (2013.01); *H01L 23/473* (2013.01); *H01L 25/07* (2013.01); *H01L 25/072* (2013.01); *H01L 25/18* (2013.01); *H01L 2224/32245* (2013.01); *H01L 2224/33* (2013.01); *H01L 2224/40137* (2013.01); *H01L 2924/181* (2013.01)

(56) References Cited

U.S. PATENT DOCUMENTS

| | | | |
|---|---|---|---|
| 9,659,844 B2 * | 5/2017 | Mukhopadhyay | .... H01L 23/367 |
| 9,661,738 B1 * | 5/2017 | Jacobsson | ............ H05K 1/0206 |
| 2001/0033477 A1 * | 10/2001 | Inoue | .................. H01L 23/4006 361/718 |
| 2009/0116197 A1 * | 5/2009 | Funakoshi | .......... H01L 21/4882 361/719 |
| 2009/0231811 A1 | 9/2009 | Tokuyama et al. | |
| 2013/0050947 A1 | 2/2013 | Kadoguchi et al. | |
| 2015/0016064 A1 | 1/2015 | Yamamoto et al. | |
| 2015/0214205 A1 | 7/2015 | Tokuyama et al. | |
| 2018/0013355 A1 | 1/2018 | Tokuyama et al. | |

FOREIGN PATENT DOCUMENTS

| | | |
|---|---|---|
| JP | 2006-202899 A | 8/2006 |
| JP | 2009-219270 A | 9/2009 |
| JP | 2012-164763 A | 8/2012 |
| JP | 2013-30649 A | 2/2013 |
| JP | 2013-62483 A | 4/2013 |
| JP | 2015-115510 A | 6/2015 |
| WO | WO 2016/140153 A1 | 9/2016 |

OTHER PUBLICATIONS

Japanese-language Written Opinion (PCT/ISA/237) issued in PCT Application No. PCT/JP2015/073926 dated Nov. 10, 2015 (Four (4) pages).

Extended European Search Report issued in counterpart European Application No. 15902264.9 dated Mar. 27, 2019 (seven (7) pages).

* cited by examiner

POWER SEMICONDUCTOR MODULE WITH HEAT DISSIPATION PLATE

TECHNICAL FIELD

The present invention relates to a structure including a heat dissipation plate, and more particularly to a power semiconductor module mounting a power semiconductor device, and a power conversion device including the power semiconductor module.

BACKGROUND ART

Power conversion devices based on switching of a power semiconductor device are widely used for consumer use, automotive use, railway use, transformer facilities, and the like because of its high conversion efficiency. The power semiconductor device generates heat by energization, and thus high heat dissipation is required. Further, the power semiconductor device is sealed with a resin or a gel to secure insulating properties.

Structures to seal a power semiconductor device with a resin are disclosed in Patent Literatures 1 and 2.

CITATION LIST

Patent Literature

PTL 1: JP 2004-303900 A
PTL 2: JP 2013-030649 A

SUMMARY OF INVENTION

Technical Problem

A semiconductor device described in Patent Literature 1 forms a flat heat dissipation surface, and thus the surface area is small and heat exchange efficiency is poor.

A semiconductor module described in Patent Literature 2 forms a heat dissipation surface having a heat sink exposed on one side. Although heat dissipation to a gas is improved by the heat sink, heat dissipation efficiency is poor due to occurrence of a bypass flow in a case where the semiconductor module is used for cooling in a liquid having superior heat dissipation than gas.

Solution to Problem

The present invention is a structure including a heat dissipation plate thermally connected to a heating element, and a resin region having a resin material that fixes the heating element and the heat dissipation plate, wherein the heat dissipation plate includes a fin portion protruding from a heat dissipation surface of the heat dissipation plate, and including a plurality of fins formed to be exposed from the sealing resin material, and a wall portion formed to protrude from the heat dissipation surface to a same side as the fins and which partitions the fin portion and the resin region, a structure including a sealing portion in a part of the resin region, and a waterway structure having a flat wall surface and having the structure inserted therein.

Advantageous Effects of Invention

According to the present invention, the structure having a heating element such as a power semiconductor device is inserted into the waterway structure having a flat wall surface, whereby a channel can be easily formed in a cooling waterway and a bypass flow can be suppressed, and thus a water flow can be efficiently guided and high dissipation can be realized.

DESCRIPTION OF EMBODIMENTS

Figure 1:
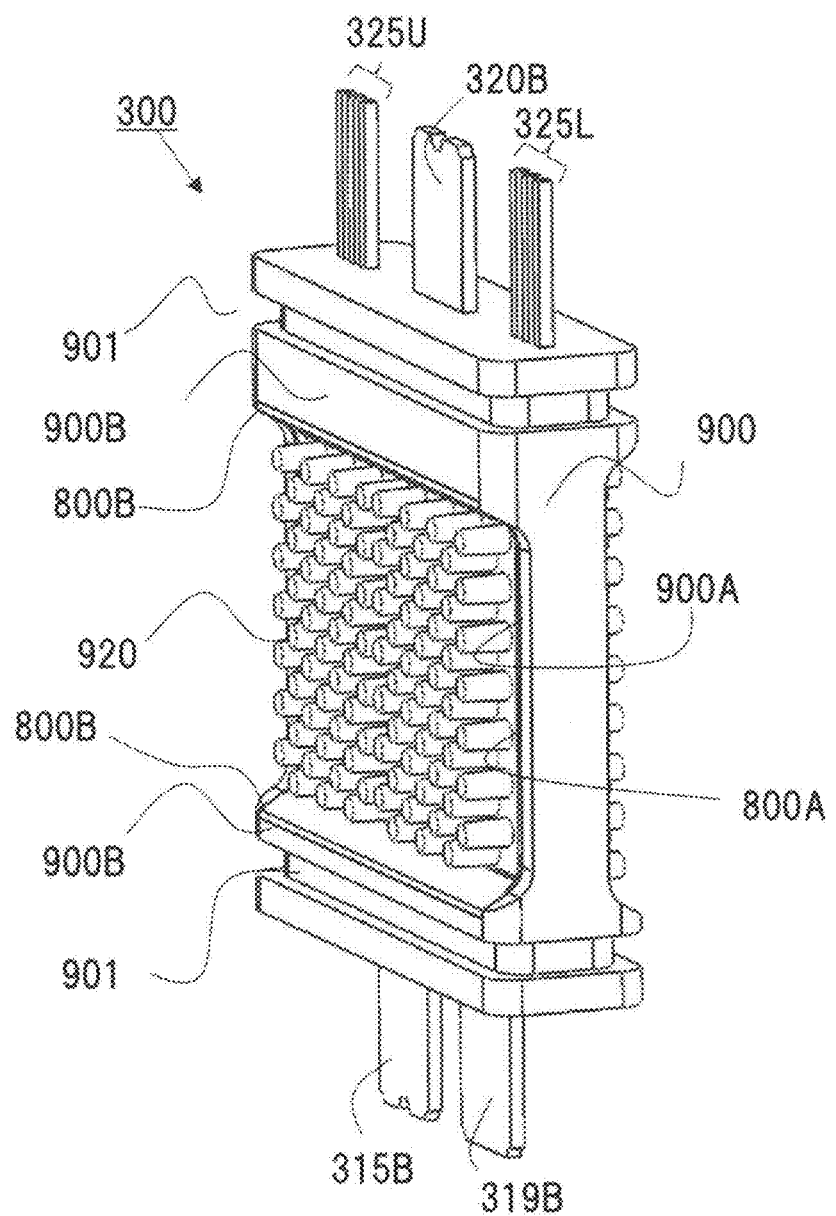
FIG. 1 is a perspective view of a power semiconductor module according to a first embodiment.

Hereinafter, a power semiconductor module used for a power conversion device to be mounted on a vehicle will be described as a favorable embodiment of a structure according to the present invention. In an embodiment of the power semiconductor module described below, configuration elements such as a power semiconductor device as a heating element, an Al base plate as a heat dissipation plate thermally connected with the heating element and a fin portion, and a sealing resin as a resin material that fixes the heating element and the heat dissipation plate will be described with reference to the drawings. In the drawings, the same reference numeral is given to the same elements, and redundant description is omitted.

FIG. 1 is a perspective view of a power semiconductor module 300 of the first embodiment. The power semiconductor module 300 includes a sealing resin 900, DC-side terminals 315B and 319B, an AC-side terminal 320B, and signal terminals 325U and 325L. The sealing resin 900 seals the power semiconductor device mounted on a metal conductor such as a lead frame or a ceramic board wiring. The terminals 325L, 320B, and 325U protrude in a row from one surface of the sealing resin 900 of the power semiconductor module 300. Further, the terminals 315B and 319B protrude in a row from one surface of the sealing resin 900 of the power semiconductor module 300. Since the DC terminals 315B and 319B are adjacent to each other, input and output currents are close to each other to exhibit an effect to reduce inductance.

A sealing portion 901 is formed in the sealing resin 900 from which the aforementioned terminals protrude. As will be described below, the power semiconductor module 300 secures the liquid-tightness of a cooling refrigerant by a member such as an O-ring disposed in the sealing portion 901 when the power semiconductor module 300 is fixed to a channel forming body 1000.

Further, the power semiconductor module 300 has wall portions 800A and 800B that separates a fin portion 920 and the sealing resin 900. The sealing resin 900 has a resin region 900A formed at the same height as the wall portion 800A and a resin region 900B formed at the same height as the wall portion 800B. The wall portion 800A is formed to be smaller than the wall portion 800B in height.

Figure 2:
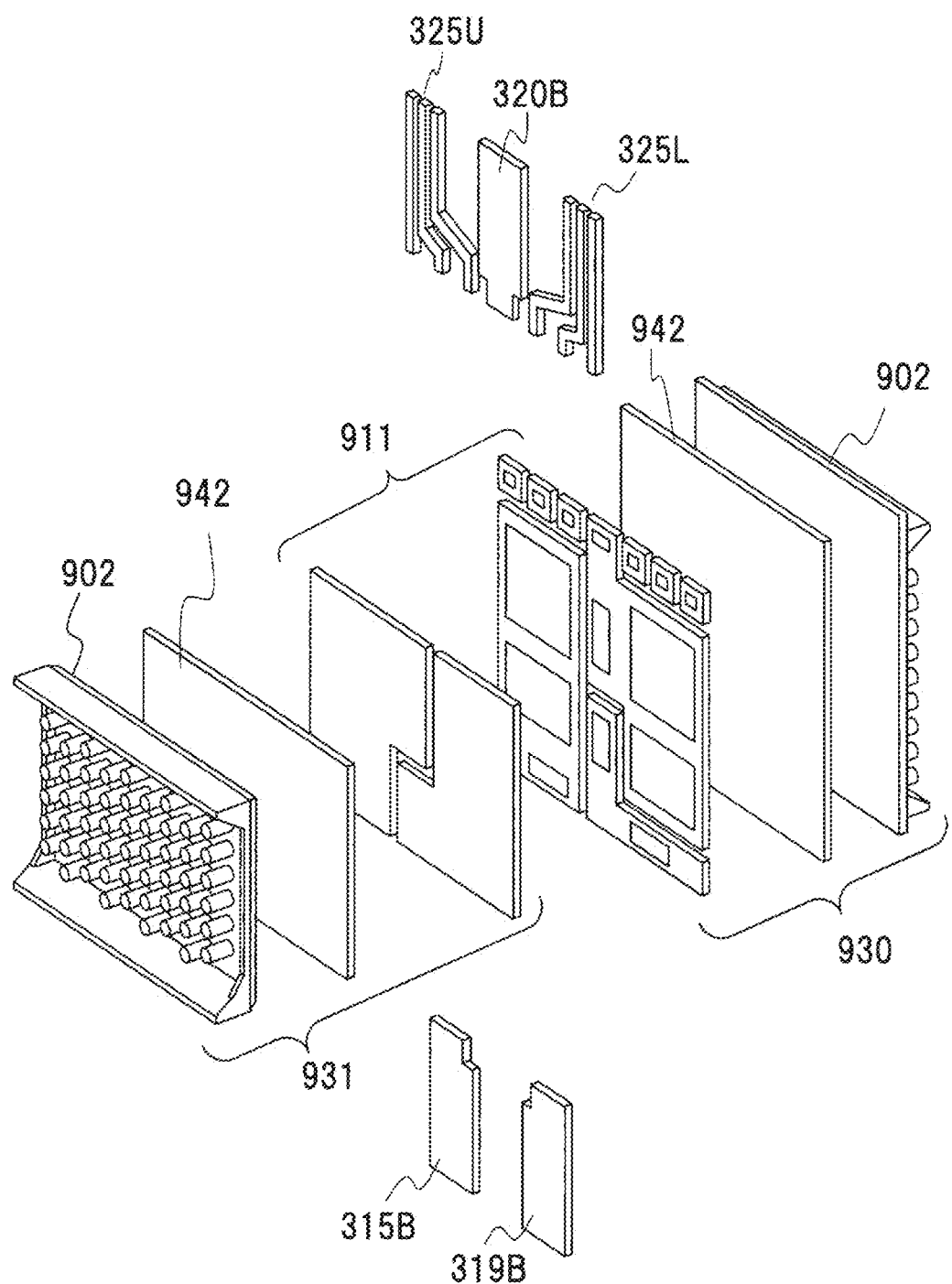
FIG. 2 is an exploded perspective view of the power semiconductor module of the first embodiment.

FIG. 2 is an exploded perspective view of the power semiconductor module 300. Note that FIG. 2 schematically illustrates only some of parts.

The power semiconductor module 300 of the present embodiment includes a ceramic board (a collector-side ceramic board 930 and an emitter-side ceramic board 931) consisting of an Al base plate 902, a ceramic insulator 942, and Al wiring 911. The collector-side ceramic board 930 will be described below. Although separately illustrated in FIG. 2 for description, the ceramic insulator 942 is connected onto the Al base 902, and the Al wiring 911 is further formed on the Al base 902, as a wiring pattern.

Figure 3:
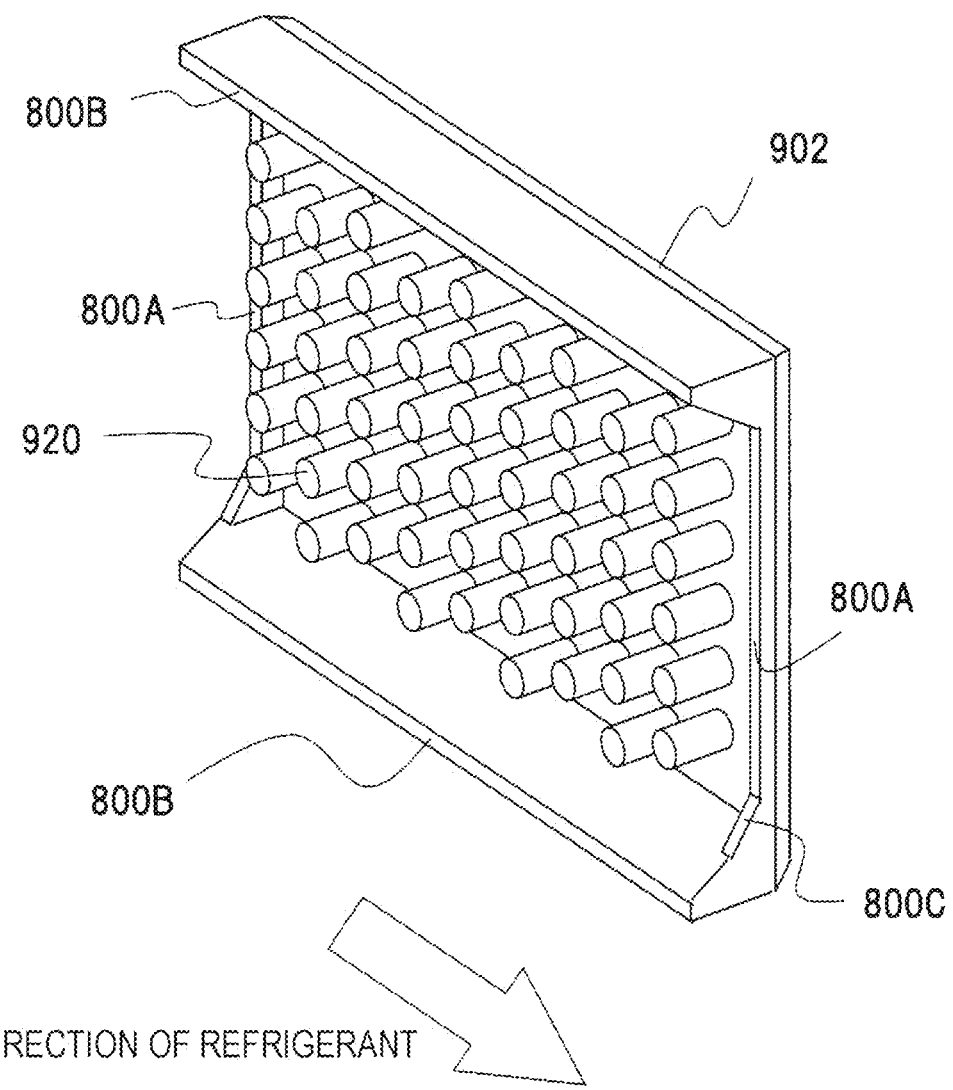
FIG. 3 is a perspective view of a heat dissipation portion.

FIG. 3 is a view for describing details of a configuration of the fin portion 920 of the power semiconductor module 300. Wall portions 800 A and 800B and a tapered portion 800C are formed on an outer periphery of the fin portion 920. These wall portions and the tapered portion are connected to the Al base 902.

The Al base 902 of the present embodiment has a substantially rectangular principal plane. The wall portion 800A is formed on a lateral-side edge portion of the Al base 902. The wall portion 800B is formed on a longitudinal-side edge portion of the Al base 902. In other words, the fin portion 920 is sandwiched by the wall portions 800A in a lateral direction and is sandwiched by the wall portions 800B in a longitudinal direction. The wall portion 800B is formed along a flow direction of a refrigerant flowing between the fins of the fin portion 920.

The wall portion 800B is formed to be higher than the wall portion 800A in the height toward a protruding direction of the fin portion 920. Since the height of the wall portion 800A is different from the height of the wall portion 800B, tapered portions 800C are formed in portions (four portions) that connect the wall portions 800A and the wall portions 800B. With the configuration, an end surface of the tapered portion 800C of the wall portion 800A and the wall portion 800B forms a continuous surface rather than a stepped shape. In the present embodiment, the fin portion 920 is formed to be higher than the wall portion 800A in height in the protruding direction, and is nearly equal to the wall portion 800B in height.

Figure 4:
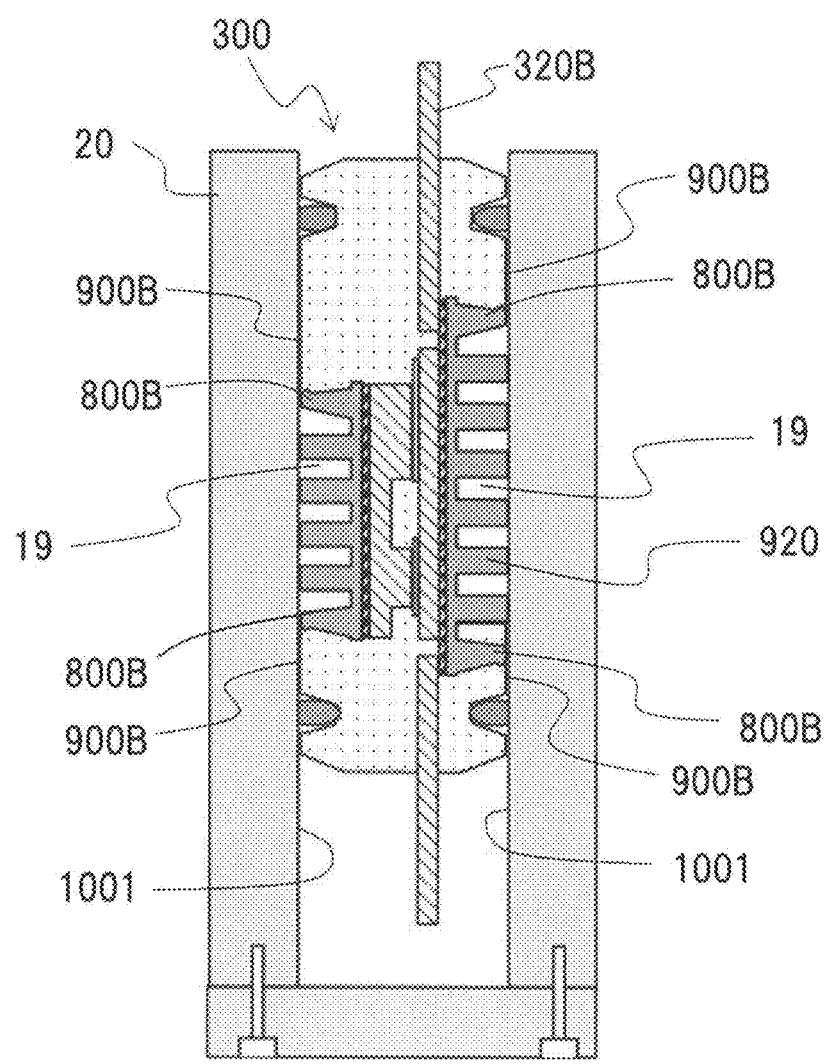
FIG. 4 is a sectional view of the power semiconductor module of the first embodiment inserted in a waterway structure 20.

FIG. 4 is a sectional view of the power semiconductor module 300 of the present embodiment inserted in a waterway structure 20. The waterway structure 20 has a storage space for storing the power semiconductor module 300, and an inner wall surface of the storage space forms a flat waterway wall 1001.

A cooling medium flows in a channel 19 formed by the fin portion 920 and the flat waterway wall 1001. In the other regions, the bypass flow of the cooling medium is suppressed by the wall portion 800B and the resin region 900B. In addition, the wall portion 800A and the resin region 900A are formed to be lower than the wall portion 800B or the like to suppress channel resistance. With the above configuration, a power semiconductor module (power conversion device) having high heat dissipation with a low pressure loss can be obtained.

A procedure of manufacturing the power semiconductor module 300 of the present embodiment will be described with reference to FIGS. 5 to 11.

Figure 5:
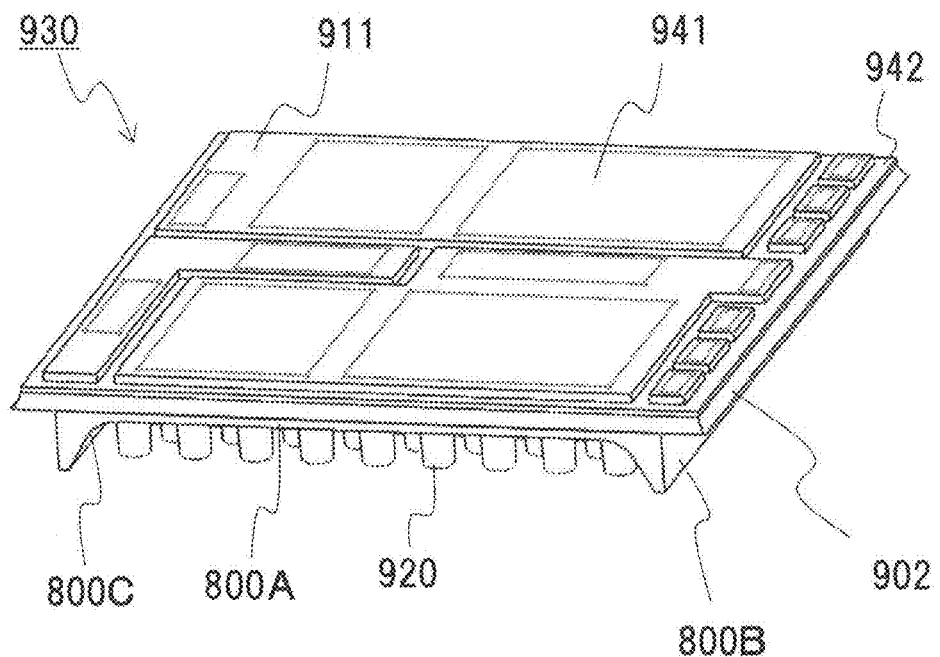
FIG. 5 is a perspective view of a connector-side ceramic board of the first embodiment.

FIG. 5 is a perspective view illustrating the collector-side ceramic board 930. The wall portions 800A and 800B and the tapered portion 800C are formed on an outer periphery of the fin portion 920 and are connected to the Al base 902. A ceramic insulator 940 is connected on the Al base 902. A wiring pattern is formed on the ceramic insulator 940 with the Al wiring 911. Ni plating 941 is formed on region to be connected by solder on the wiring pattern.

The Al wiring 911, the Al base 902, the fins 920, the wall portions 800A and 800B, and the tapered portion 800C are integrally formed by molten metal in which molten Al is poured into a mold, and then insulation between the patterns and shape adjustment of the fin portion are performed by etching or machining.

Figure 6:
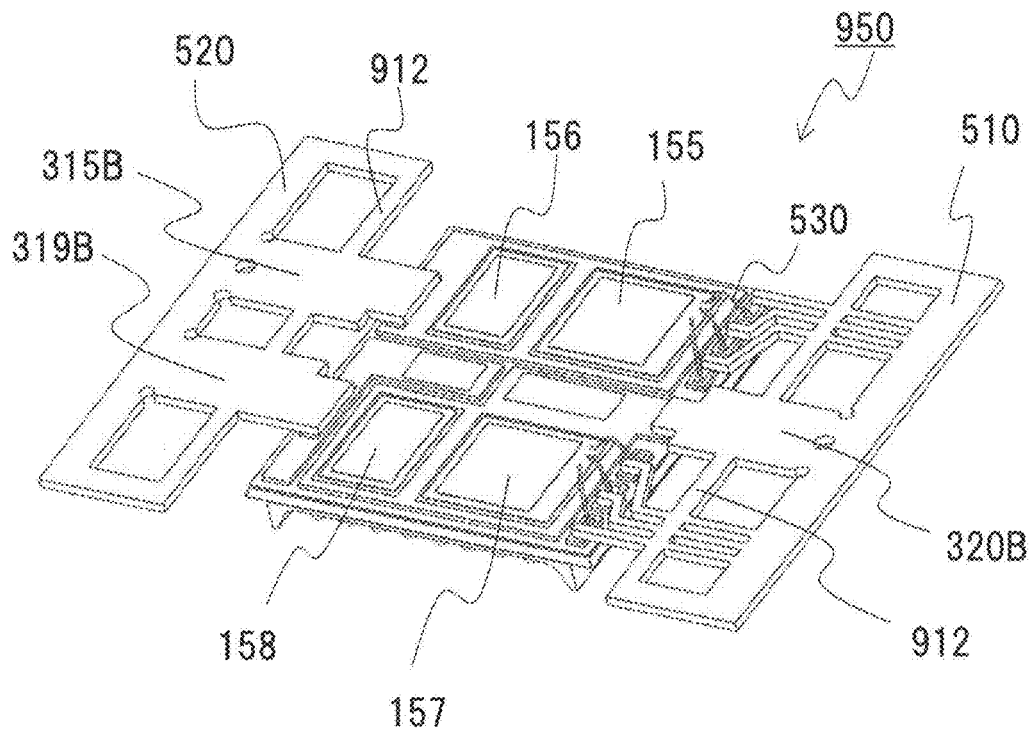
FIG. 6 is a perspective view of a connector-side ceramic board assembly of the first embodiment.

FIG. 6 is a perspective view illustrating a collector-side board assembly 950. In the collector-side board assembly 950, an upper arm-side IGBT 155, an upper arm-side diode 156, a lower arm-side IGBT 157, a lower arm-side diode 158, and lead frames 510 and 520 are soldered to the collector-side ceramic board 930. Here, the IGBT is an abbreviation for insulated gate bipolar transistor.

The lead frames 510 and 520 have tie bars 912 to prevent terminal portions from being buried with a sealing resin during transfer molding described below. The lead frame 510 is disposed on a side close to the IGBTs 155 and 157, and the lead frame 520 is disposed on a side close to the diodes 156 and 158. The lead frame 510 includes a terminal portion that is to serves as the AC-side terminal 320B and the signal terminals 325U and 325L below. The lead frame 520 includes a terminal portion that is to serve as the DC positive-side terminal 315B and a DC negative-side terminal 329B below.

The lead frame 510 is electrically connected to gate pads of the IGBTs 155 and 157 by the Al wire 530.

Figure 7:
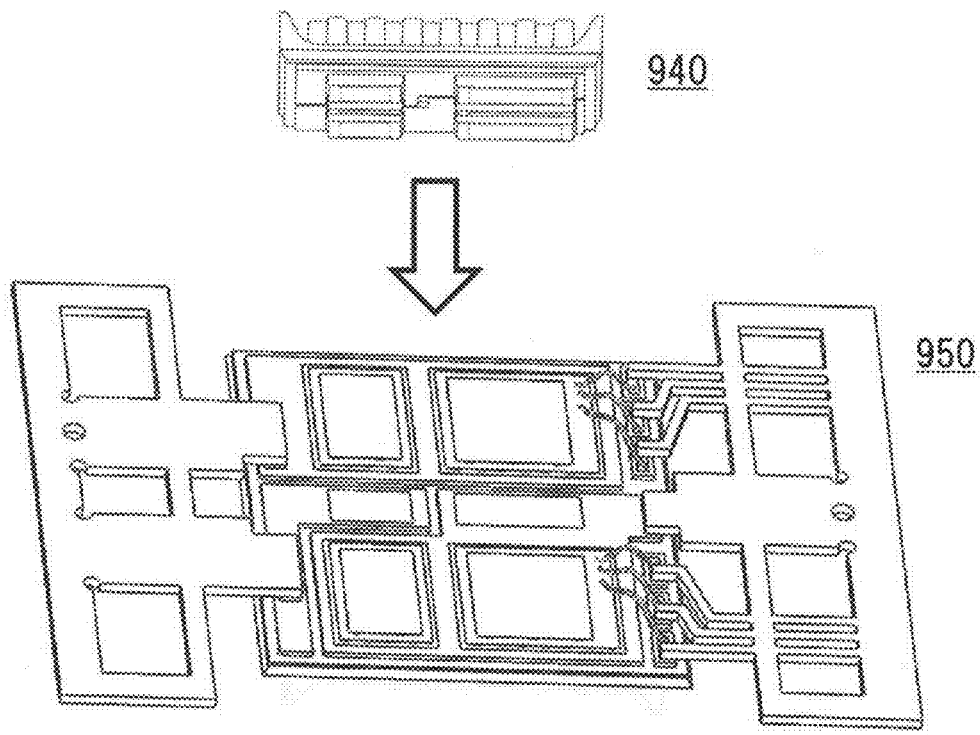
FIG. 7 is a perspective view of the power semiconductor module of the first embodiment during manufacture.

FIG. 7 is a perspective view of the collector-side board assembly 950 and the emitter-side ceramic board 940. The emitter-side ceramic board 940 is soldered to the collector-side board assembly 950.

Figure 8:
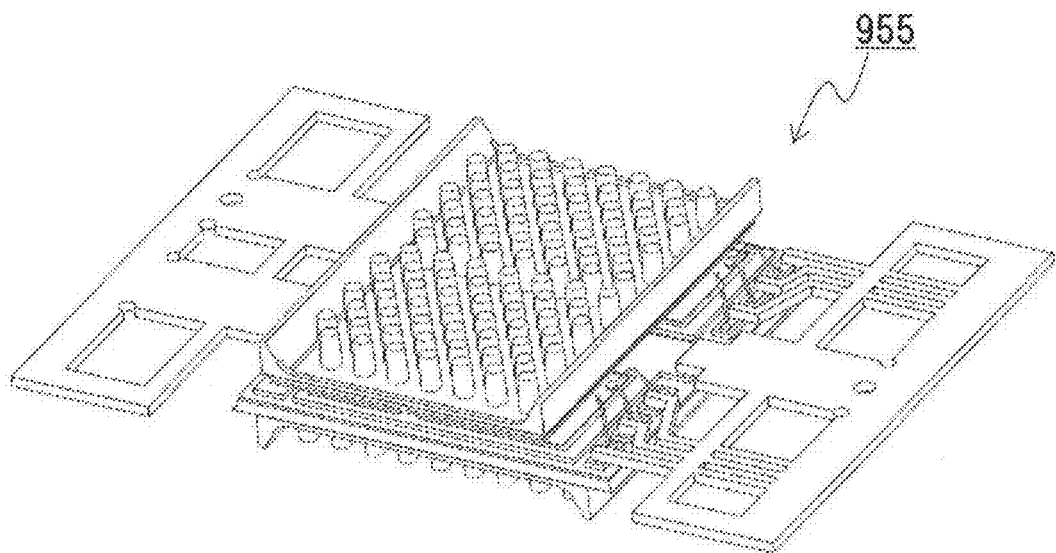
FIG. 8 is a perspective view of the power semiconductor module of the first embodiment during manufacture.

FIG. 8 illustrates a perspective view of a board assembly 955. The board assembly 955 is in a state where the emitter-side ceramic board 940 and the collector-side board assembly 950 are assembled.

Figure 9:
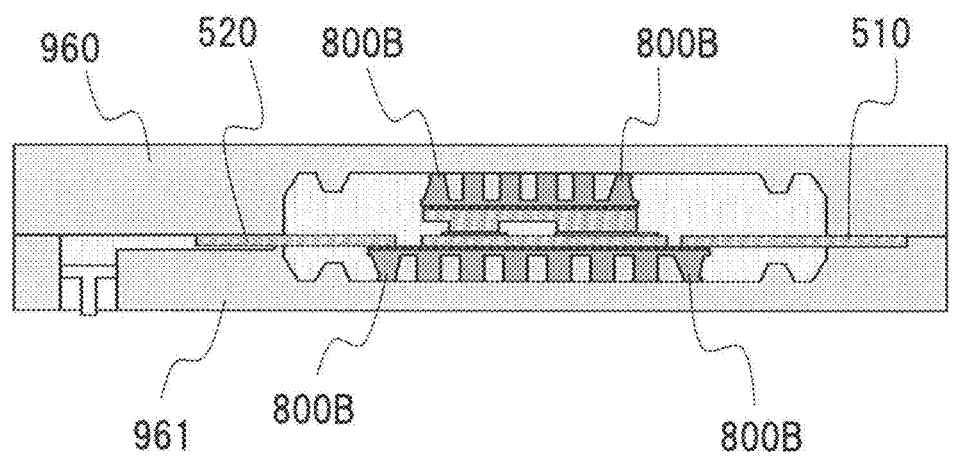
FIG. 9 is a sectional view of a transfer molding process.

FIG. 9 illustrates a schematic view illustrating a process of transfer-molding the board assembly 955. The board assembly 955 is clamped with transfer molding molds 960 and 961. At that time, the end surfaces of the wall portions 800 are pushed by inner surfaces of the transfer molding molds 960 and 961 and are deformed. With the deformation, there is an effect to absorb variation in height caused in the process of manufacturing the wall portions to bring the wall portions in close contact with the molds. Note that FIG. 9 illustrates only one stage surface passing through the wall portion 800B. However, the transfer molding molds 960 and 961 are also in contact/close contact with the end surfaces of the wall portions 800A and the tapered portions 800C.

The wall portions 800 deform and absorb the variation in the manufacturing process, thereby to be in close contact with the molds around the fin portion 920. Therefore, an inflow of the resin into the fin portion can be prevented. By the above process, a power semiconductor module having high heat dissipation with a low pressure loss while suppressing a bypass flow can be manufactured.

Figure 10:
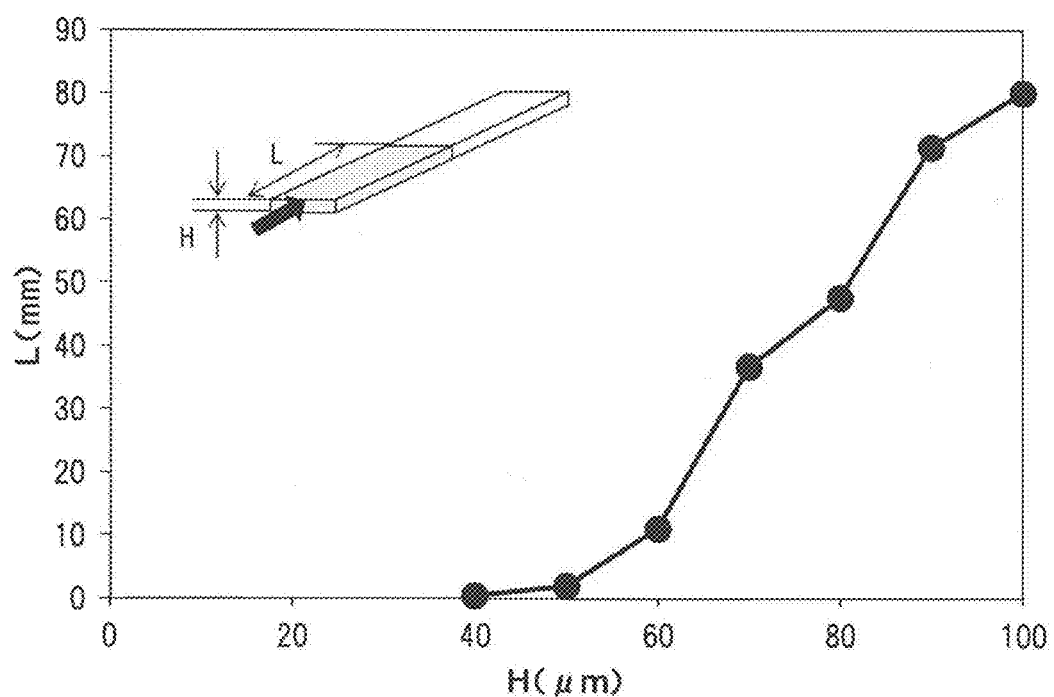
FIG. 10 illustrates a relationship between a filling distance and a gap in transfer molding.

FIG. 10 illustrates a relationship between a filling distance L and a gap H of the sealing resin. The graph illustrates the filling distance L of when the sealing resin is injected from an end portion of the gap having the height H with respect to the gap. As the gap H becomes larger, the filling distance L tends to become larger. From FIG. 10, it can be seen that the filling distance L is substantially zero when the gap H is 40 μm or less.

Therefore, it can be understood that the inflow of the sealing resin into the fin portion can be prevented by setting the gap H between the wall portion 800 and the transfer molding mold to be 40 μm or less. The transfer molding process was carried out at a mold temperature of 175° C. and a molding pressure of 5 MPa.

Figure 11:
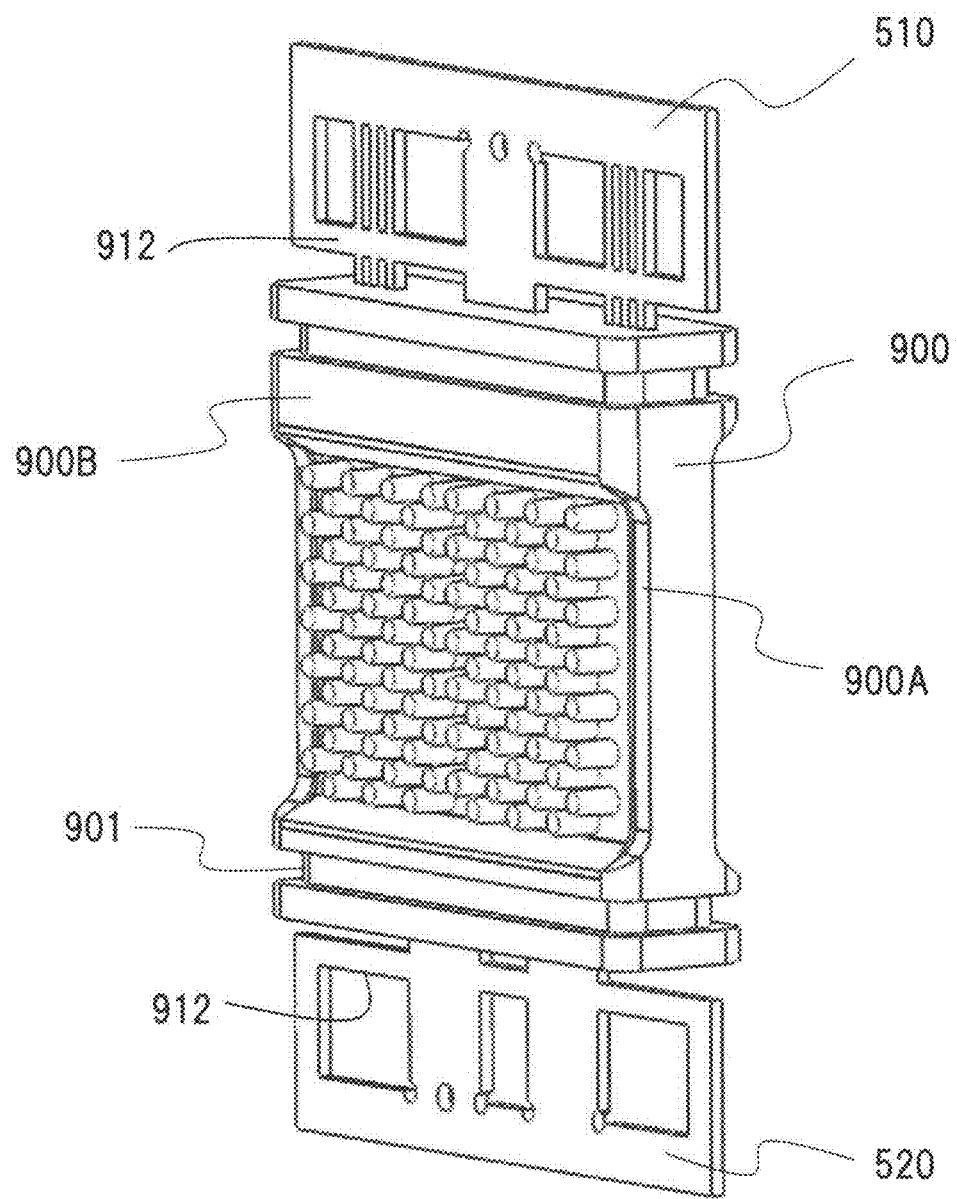
FIG. 11 is a perspective view of the power semiconductor module of the first embodiment during manufacture.

FIG. 11 illustrates an external perspective view of the power semiconductor module 300 after transfer molding. Immediately after the transfer molding, the terminals are connected to each other by the tie bars 912. The tie bars 912 are cut after the transfer molding. As a result, the terminals are electrically separated from each other, resulting in the power semiconductor module 300 illustrated in FIG. 1.

Figure 12:
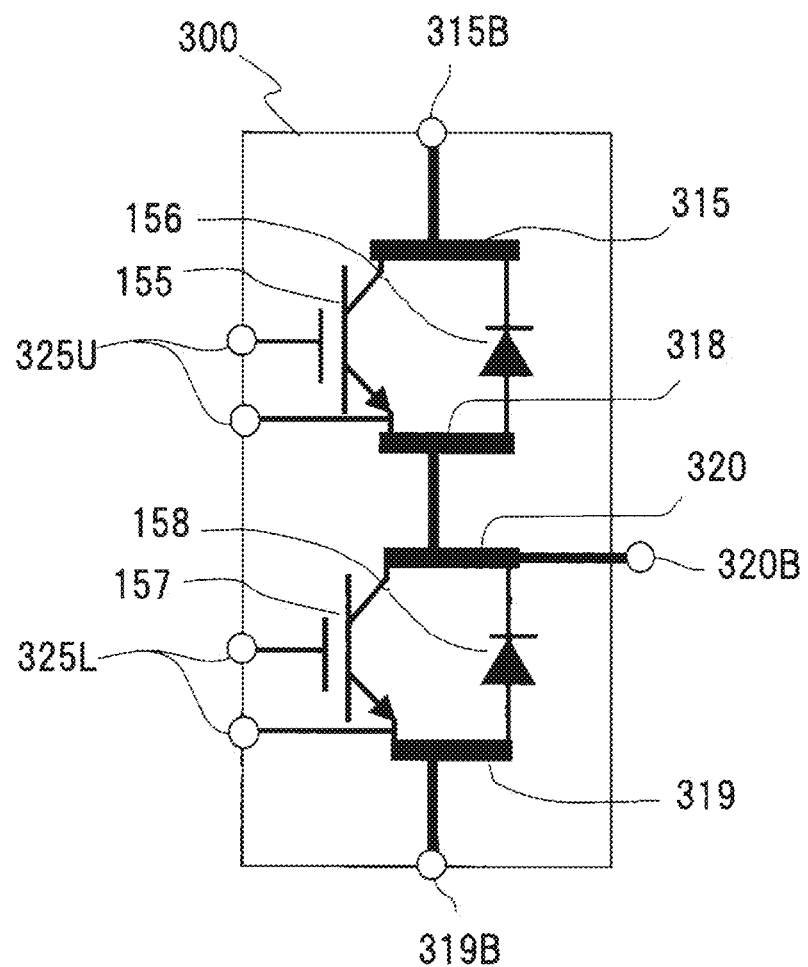
FIG. 12 is a circuit diagram of a power semiconductor module.

FIG. 12 is a circuit diagram of the power semiconductor module of the present embodiment. The terminal 315B is output from a collector side of an upper arm circuit and is connected to a positive electrode side of a battery or a capacitor. The terminal 325U is output from a gate and an emitter sense of the IGBT 155 of the upper arm circuit. The terminal 319B is output from an emitter side of a lower arm circuit and is connected to a negative electrode side of the battery or the capacitor, or to GND. The terminal 325L is output from a gate and an emitter sense of the IGBT 157 of the lower arm circuit. The terminal 320B is output from a collector side of the lower arm circuit and is connected to a motor. In a case of natural grounding, the lower arm circuit is connected to a negative electrode side of the capacitor instead of to the GND.

The power semiconductor module of the present embodiment has a 2-in-1 structure in which two arm circuits of the upper arm circuit and the lower arm circuit are integrated into one module. In a case of using a 3-in-1 structure, a 4-in-1 structure, a 6-in-1 structure or the like, other than the 2-in-1 structure, the number of output terminals from the power semiconductor module can be reduced and downsized.

Figure 13:
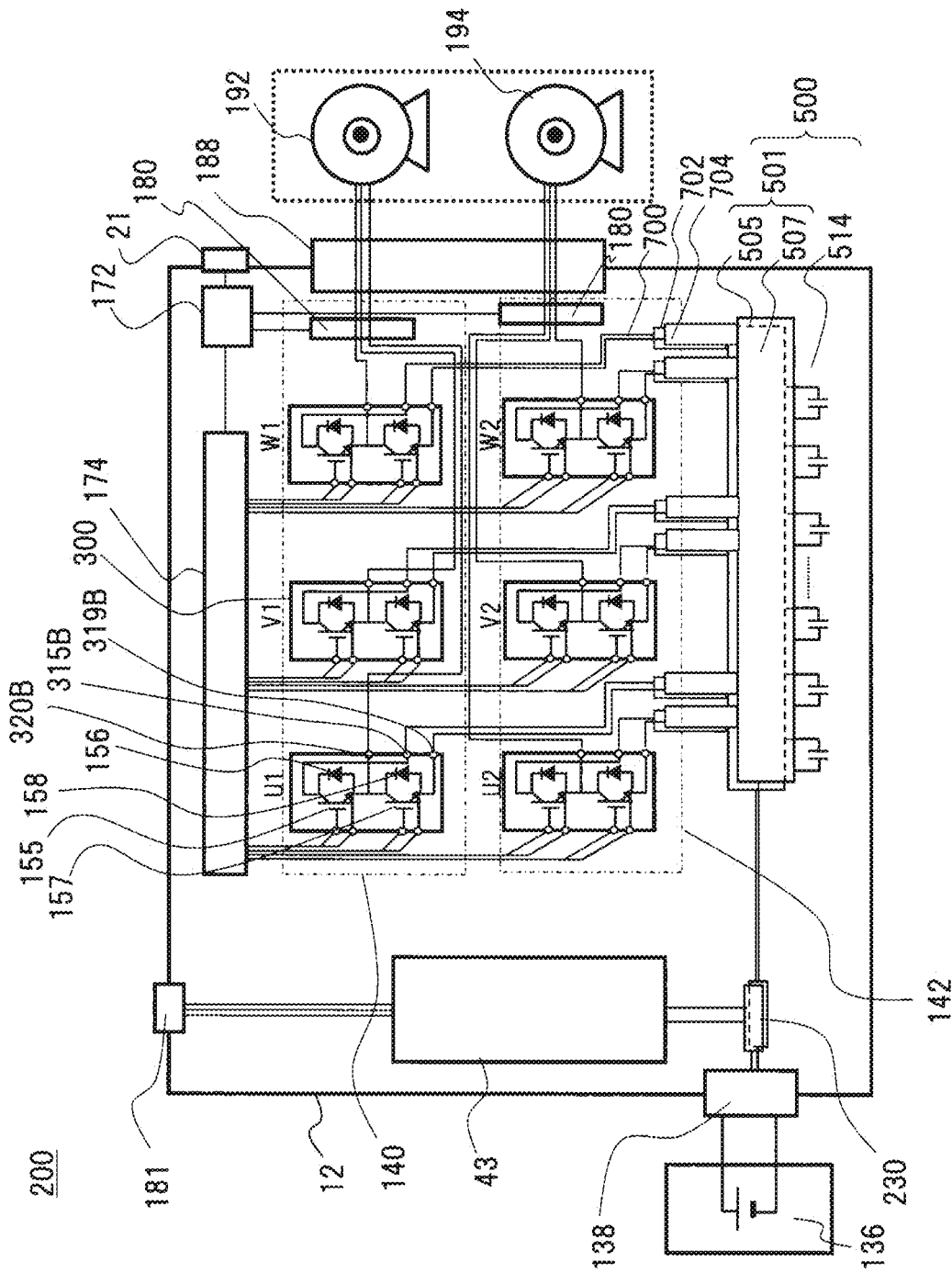
FIG. 13 is a circuit diagram of a power conversion device.

FIG. 13 is a circuit diagram of a power conversion device using the power semiconductor module of the present embodiment. A power conversion device 200 includes inverter circuit units 140 and 142, an inverter circuit unit 43 for auxiliary machine, and a capacitor module 500. The inverter circuit units 140 and 142 are provided with a plurality of the power semiconductor modules 300, and configures a three-phase bridge circuit by connecting the plurality of power semiconductor modules 300. When the current capacity is large, a larger number of the power semiconductor modules 300 is further connected in parallel and these parallel connections are performed corresponding to each phase of the three-phase inverter circuit, whereby an increase in the current capacity can be handled. Alternatively, the increase in the current capacity can be handled by connecting the power semiconductor devices built in the power semiconductor modules 300 in parallel.

The inverter circuit unit 140 and the inverter circuit unit 142 are the same in a basic circuit configuration, and are basically the same in a control method and an operation. Since an outline of a circuit operation of the inverter circuit unit 140 and the like is known, a detailed description is omitted here.

As described above, the upper arm circuit includes the upper arm IGBT 155 and the upper arm diode 156 as a switching power semiconductor device, and the lower arm circuit includes the lower arm IGBT 157 and the lower arm diode 158. The IGBTs 155 and 157 perform a switching operation upon receipt of a drive signal output from one or the other of the two driver circuits that configure a driver circuit 174 to convert the DC power supplied from a battery 136 into three-phase AC power.

The upper arm IGBT 155 and the lower arm IGBT 157 include a collector electrode, an emitter electrode (signal emitter electrode terminal), and a gate electrode (gate electrode terminal). The upper arm diode 156 and the lower arm diode 158 have two electrodes of a cathode electrode and an anode electrode. The cathode electrodes of the diodes 156 and 158 are electrically connected to the collector electrodes of the IGBTs 155 and 157, respectively, and the anode electrodes of the diodes 156 and 158 are electrically connected to the emitter electrodes of the IGBTs 155 and 157, respectively so that the direction from the emitter electrodes to the collector electrodes of the upper arm IGBT 155 and the lower arm IGBT 157 becomes a forward direction. Note that, as a power semiconductor device, a metal oxide semiconductor field effect transistor (MOSFET) may be used. In this case, the upper arm diode 156 and the lower arm diode 158 are unnecessary.

Temperature information of the upper and lower arm series circuits is input from temperature sensors (not illustrated) provided in the upper and lower arm series circuits to a microcomputer. Further, voltage information of the DC positive side of the upper and lower arm series circuits is input to the microcomputer. The microcomputer detects over-temperature and over-voltage on the basis of the information, and stops the switching operation of all of the upper arm IGBT 155 and the lower arm IGBT 157 when an over-temperature or an over-voltage is detected, to protect the upper and lower arm series circuits from the over-temperature or the over-voltage.

Figure 14:
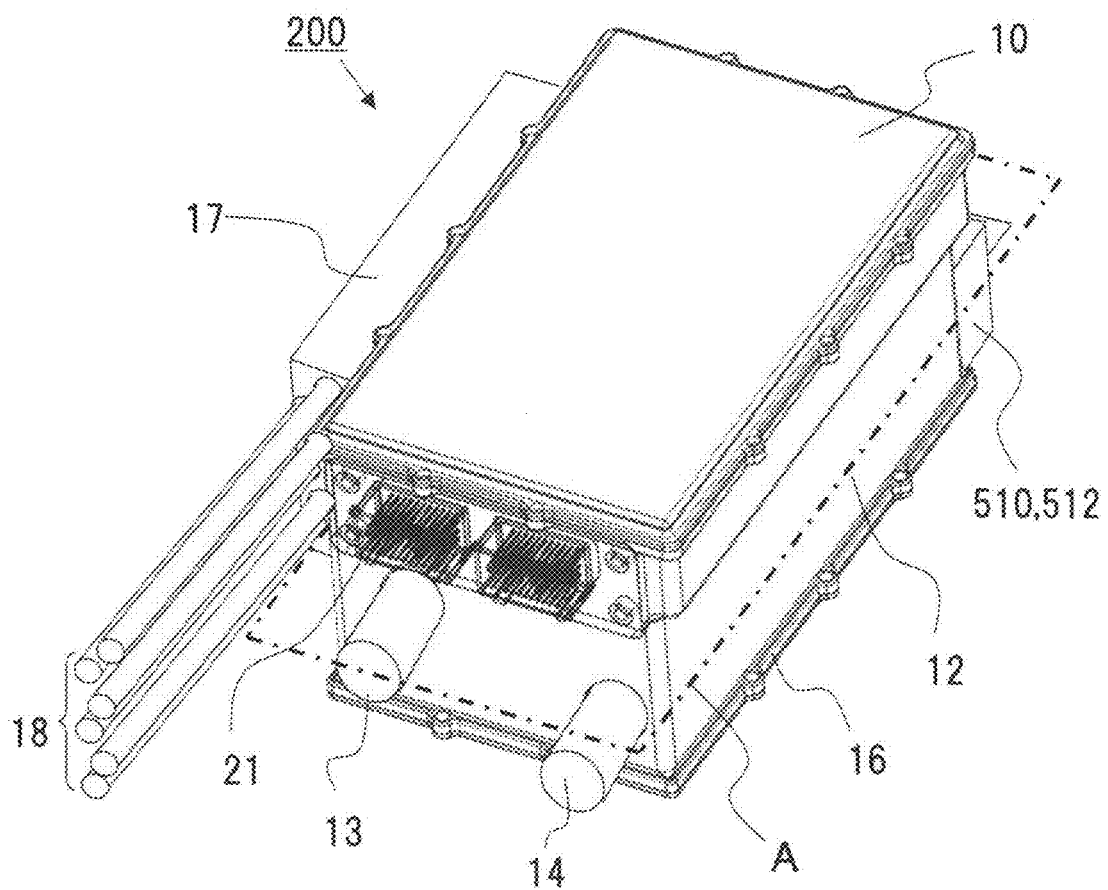
FIG. 14 is a perspective view of a power conversion device.

FIG. 14 is a perspective view illustrating an external appearance of the power conversion device 200. The external appearance of the power change device 200 according to the present embodiment is formed by fixing a housing 12 having a substantially rectangular top or bottom surface, an upper casing 10 provided on one of a short-side outer periphery of the housing 12, and a lower case 16 for blocking a lower opening of the housing 12. Since the shape of the bottom view or the top view of the housing 12 is made substantially rectangular, installation to a vehicle is easy and production is easy.

Figure 15:
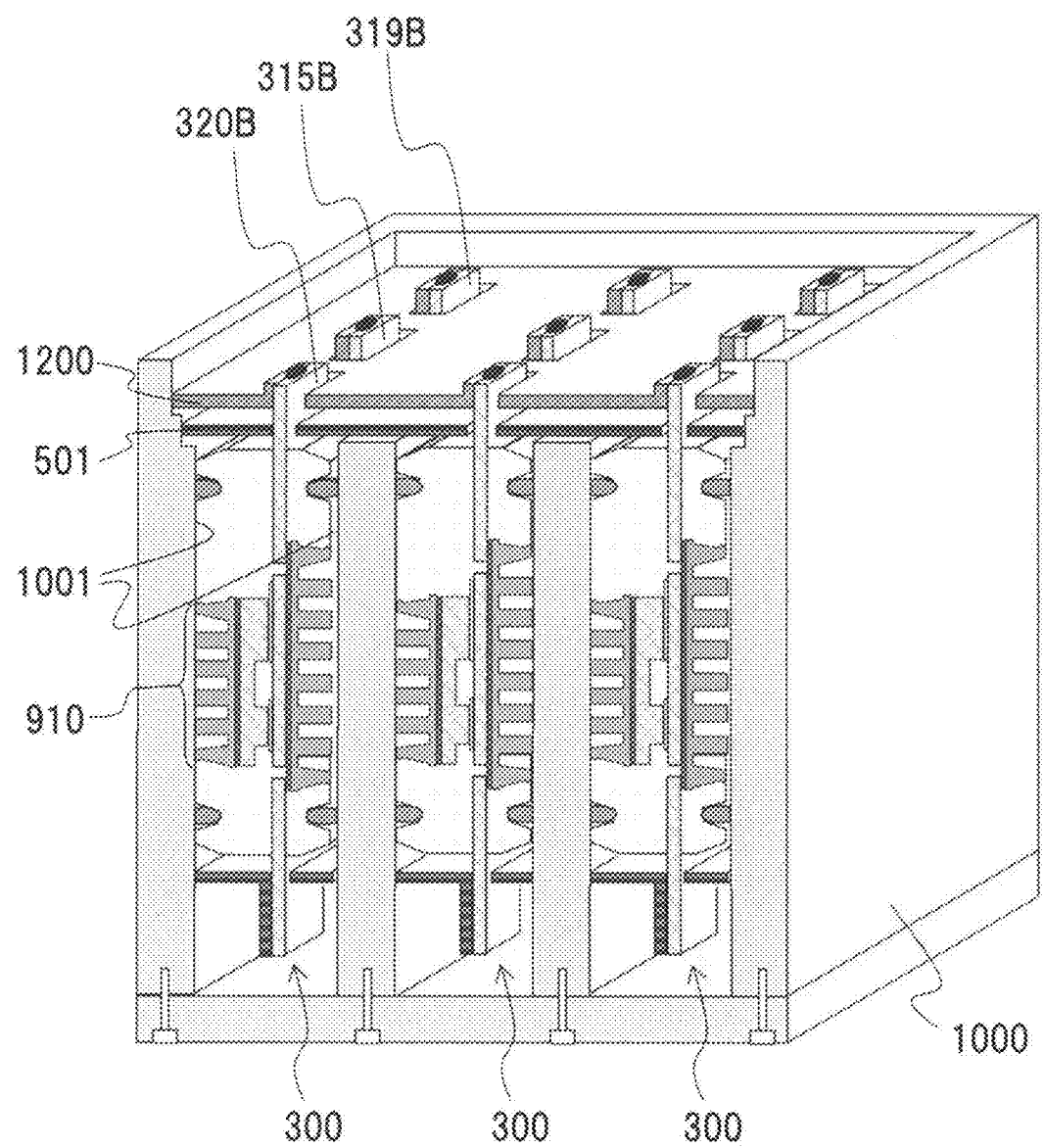
FIG. 15 is a sectional perspective view of the power conversion device.

FIG. 15 is a schematic view illustrating a section structure of the power conversion device 200. The power semiconductor module 300 is installed in the channel forming body 1000 similarly to the installation structure illustrated in FIG. 4.

After the power semiconductor module 300 is inserted into the channel forming body, a laminated wiring board 501 on which components are mounted is assembled, and the signal terminals and the laminated wiring board 501 are electrically connected. Further, the terminals 320B, 315B, and 320B through which a large current flows are welded to terminals protruding from a plate 1200 on which bus bar wiring is laminated in multiple layers. The laminated wiring board 501 and the plate 1200 are stereoscopically laminated, thereby to downsize the power conversion device.

The channel forming body 1000 forms a refrigerant channel into which a refrigerant for cooling the power semiconductor module 300 flows. The channel forming body 1000 has the wall surface 1001. The wall surface 1001 forms a channel through which the refrigerant flows between a heat dissipation portion 910 of the power semiconductor module 300 and the wall surface 1001. The wall surface 1001 has a planar structure not to allow the refrigerant to flow between the sealing resin surface 900B of the power semiconductor module 300 and the wall surface 1001. The channel forming body 1000 is formed such that the distance between the wall surfaces 1001 facing each other and the distance between the sealing resin surface 900B on one side and the sealing resin surface 900B on the other side, of the power semiconductor module 300, become substantially equal. An elastic body such as an O ring is provided on the sealing portion 901 of the power semiconductor module 300.

The power semiconductor module 300 is inserted into the channel forming body 1000 such that the sealing resin surface 900B come in contact with the wall surface 1001 of the channel forming body 1000. With the configuration, the power semiconductor module 300 is disposed such that the tips of the fin portion 920 formed to be substantially flush with the sealing resin surface 900B come to contact with the wall surface 1001 of the channel forming body 1000. Therefore, the refrigerant flowing between the fin portion 920 and the wall surface 1001 is restrained from flowing between the sealing resin surface 900B and the wall surface 1001 and between the tips of the fins and the wall surface 1001 as a bypass flow. Since the heat dissipation portion 910 is configured from a high-temperature conductor 920 having high thermal conductivity, the heat of the power semiconductor device can be efficiently cooled. Therefore, the power semiconductor module 300 of the present embodiment is excellent in heat dissipation.

The channel through which the refrigerant flows is configured from a combination of the fin structure formed on the power semiconductor module 300 side and the wall surface 1001 on a plane formed on the channel forming body 1000 side. With the simplification of the structure, the power conversion device can be easily manufactured.

In addition, in the present embodiment, approximately the same plane means that planes are manufactured to become the same plane as much as possible. Steps that do not exceed 100 μm, such as a step caused by resin curing shrinkage or a difference in thermal expansion between members, and surface roughness, are less affected in suppressing the bypass flow and are therefore included in approximately the same plane.

The channel forming body 1000 is not particularly limited as long as the channel forming body has a watertight structure. However, the channel forming body 1000 can be manufactured using metal such as aluminum or aluminum die cast, a thermoplastic resin such as polyphenylene sulfide, polybutylene terephthalate, polyamide, polyimide, or polytetrafluoroethylene, or a thermosetting resin such as an epoxy resin.

Figure 16:
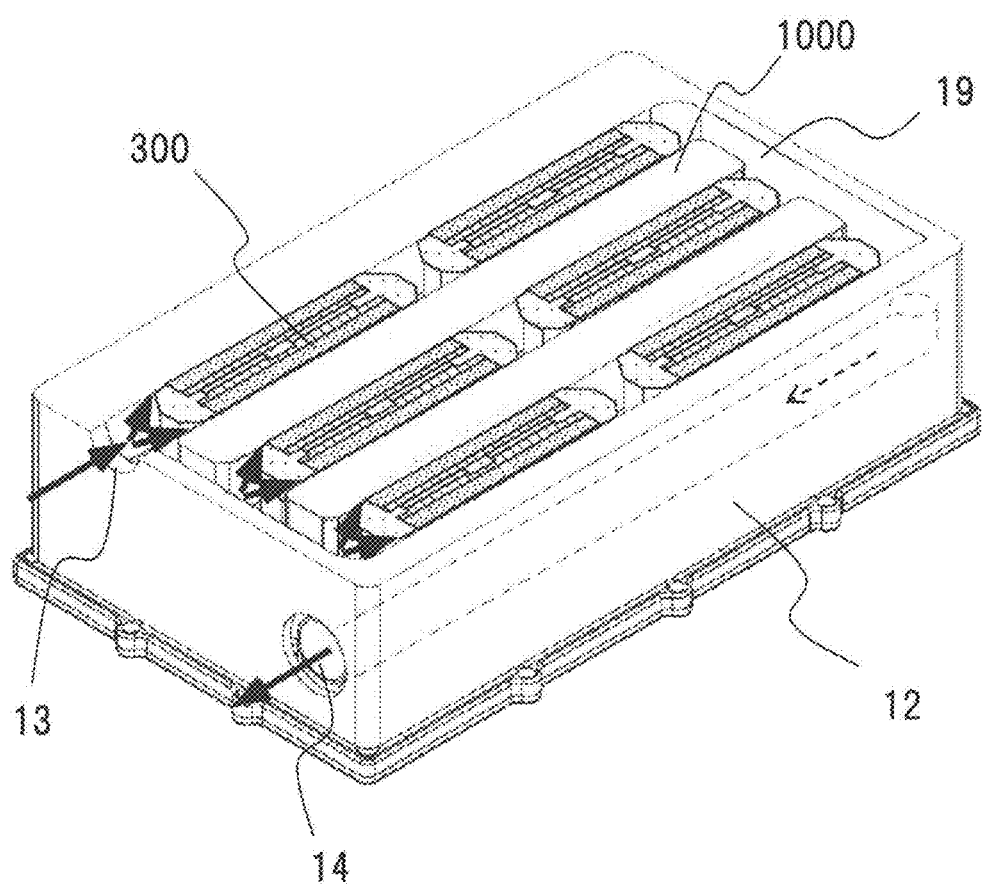
FIG. 16 is a sectional view of a power conversion device.

FIG. 16 is a sectional view in a section A of FIG. 14. The housing 12 forms the channel forming body 1000. The refrigerant flowing into the waterway 19 through a cooling water inlet 13 flows in the waterway 19 as indicated by the arrows and is discharged through a cooling water outlet 14. In the present embodiment, six power semiconductor devices 300 are arranged along the flow of cooling water in the waterway 19.

Further, an embodiment is not limited to the present embodiment, and metal plating is applied to a surface of the power semiconductor module 300 of the above-described embodiment, the surface being lower than the sealing portion and being in contact with the cooling water. With the configuration, the sealing resin is prevented from being directly in contact with the cooling water, and a decrease in chip insulating properties due to absorption of water by the sealing resin can be suppressed.

Figure 17:
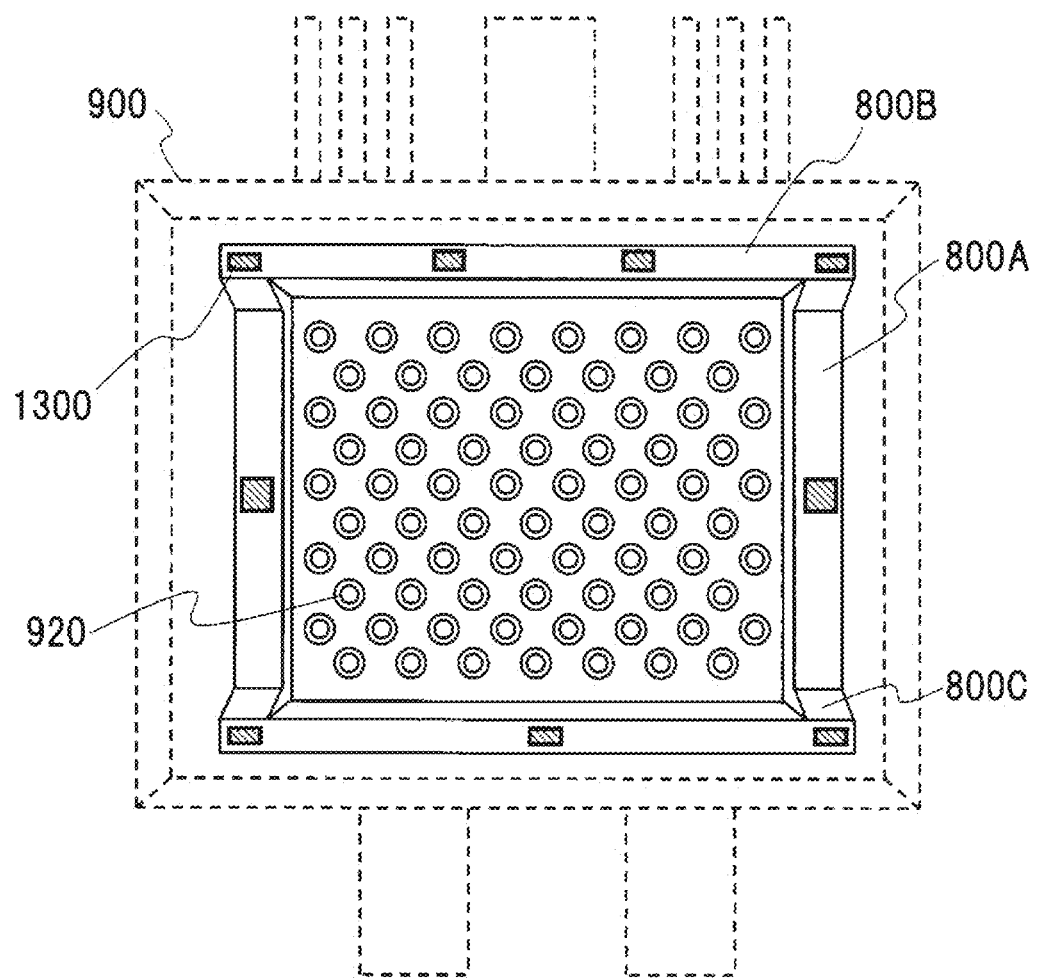
FIG. 17 is a schematic view of a power semiconductor module in a first modification.

FIG. 17 is a schematic view for describing a structure as a modification of a power semiconductor module of the present invention. In FIG. 17, to facilitate understanding, a wall portion, a fin portion, and a stress support portion 1300 are illustrated by the solid lines, and a sealing resin and terminals are illustrated by broken lines. In particular, hatched members are the stress support portion 1300. The stress support portion 1300 is disposed directly under a wall portion 800 formed on an outer periphery of a fin portion 920. A plurality of the stress support portions 1300 is disposed.

Figure 18:
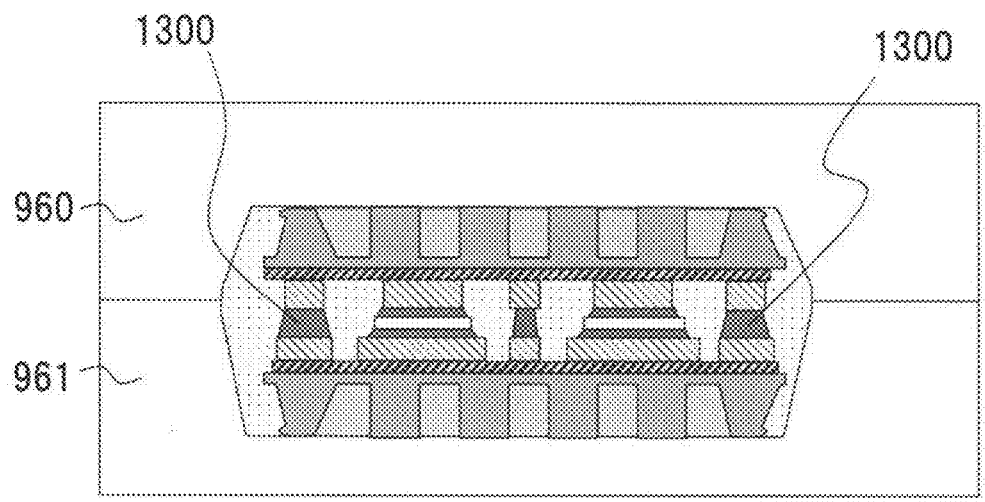
FIG. 18 is a sectional view of a transfer molding process in the first modification.

FIG. 18 is a schematic view of the power semiconductor module according to the modification illustrated in FIG. 17 at the time of transfer molding. The stress support portion 1300 is formed by connecting wiring patterns provided on a collector-side ceramic board and an emitter-side ceramic board with connecting material such as solder. Since the stress support portion is formed of the wiring patterns and the connecting member such as solder, an additional process or member for forming the stress support portion is unnecessary, and the productivity is excellent and the cost is low.

By providing the stress support portion 1300 to overlap with the wall portion 800 in this way, the stress support portion 1300 supports mold clamping force at the time of transfer molding, thereby to reduce the stress applied to the semiconductor device to prevent device destruction.

Figure 19:
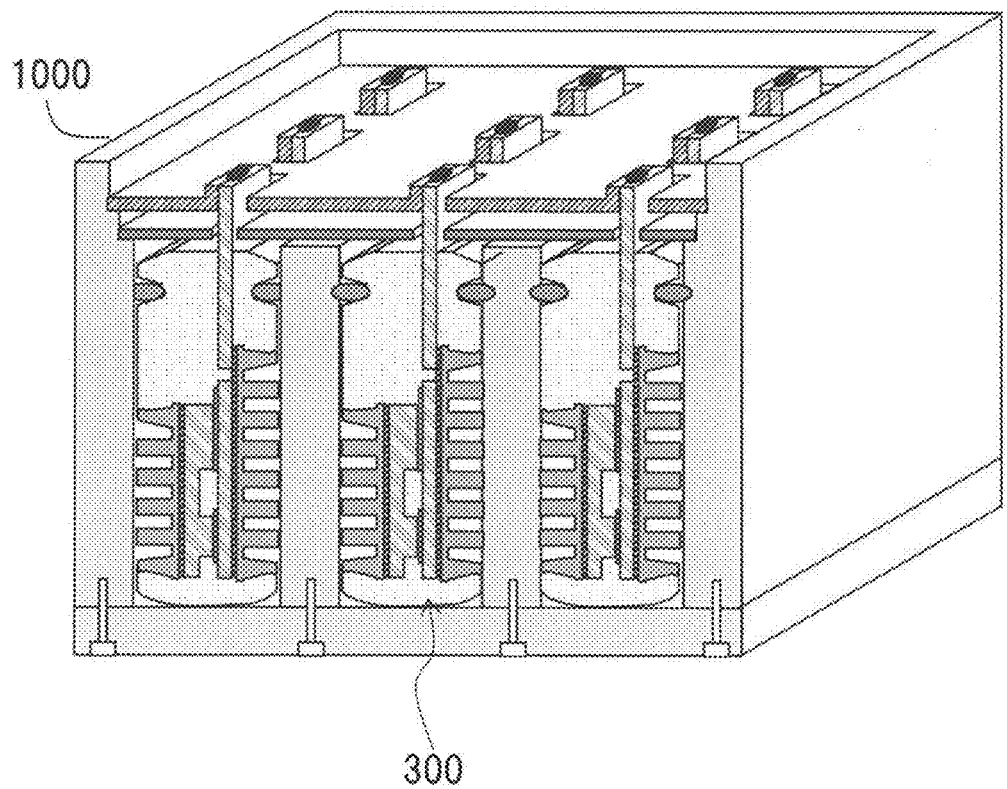
FIG. 19 is a sectional perspective view of a power conversion device of a second embodiment.

FIG. 19 illustrates a sectional perspective view of a power conversion device according to a second embodiment. The point of difference from the first embodiment is that a terminal of a power semiconductor module comes out from one direction. The power semiconductor module of the present embodiment has an effect to facilitate insertion into a channel forming body 1000.

Figure 20:
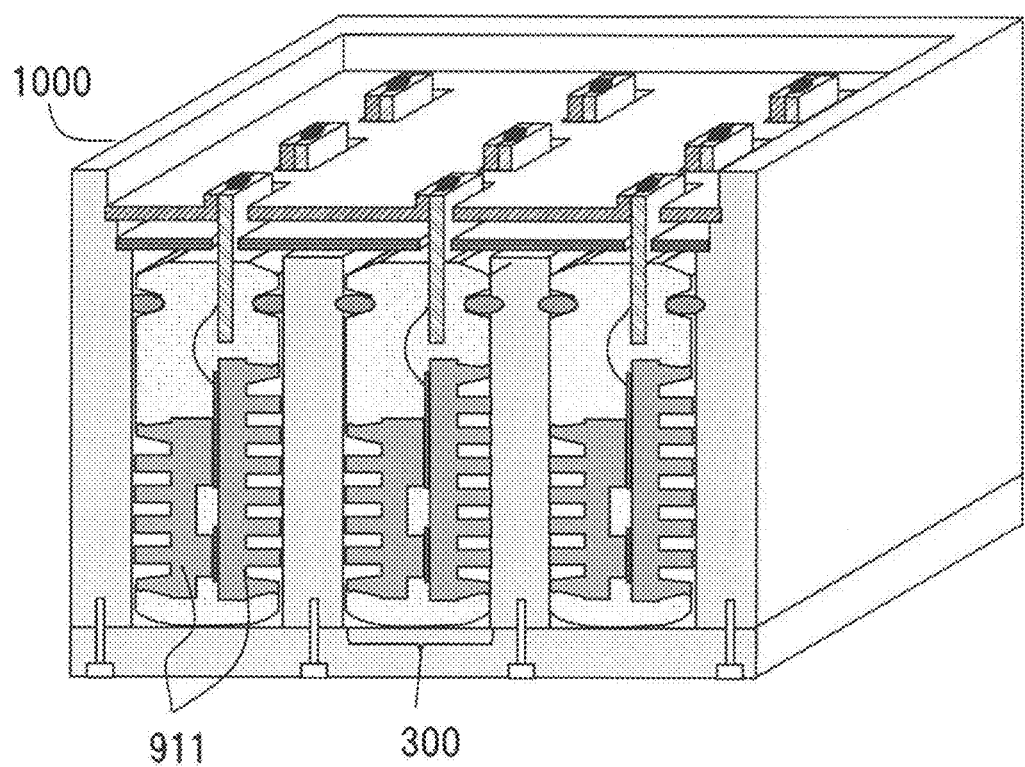
FIG. 20 is a sectional perspective view of a power conversion device of a third embodiment.

FIG. 20 is a sectional perspective view of a power conversion device according to a third embodiment. The points of difference from the first embodiment are that a waterway forming body 1000 is made of a resin, a power semiconductor module has no insulating layer, and a cooling medium is an insulating oil. Since the insulating oil is used as the cooling medium, an insulating layer is unnecessary inside the power semiconductor module, and the power conversion device can be downsized.

Figure 21:
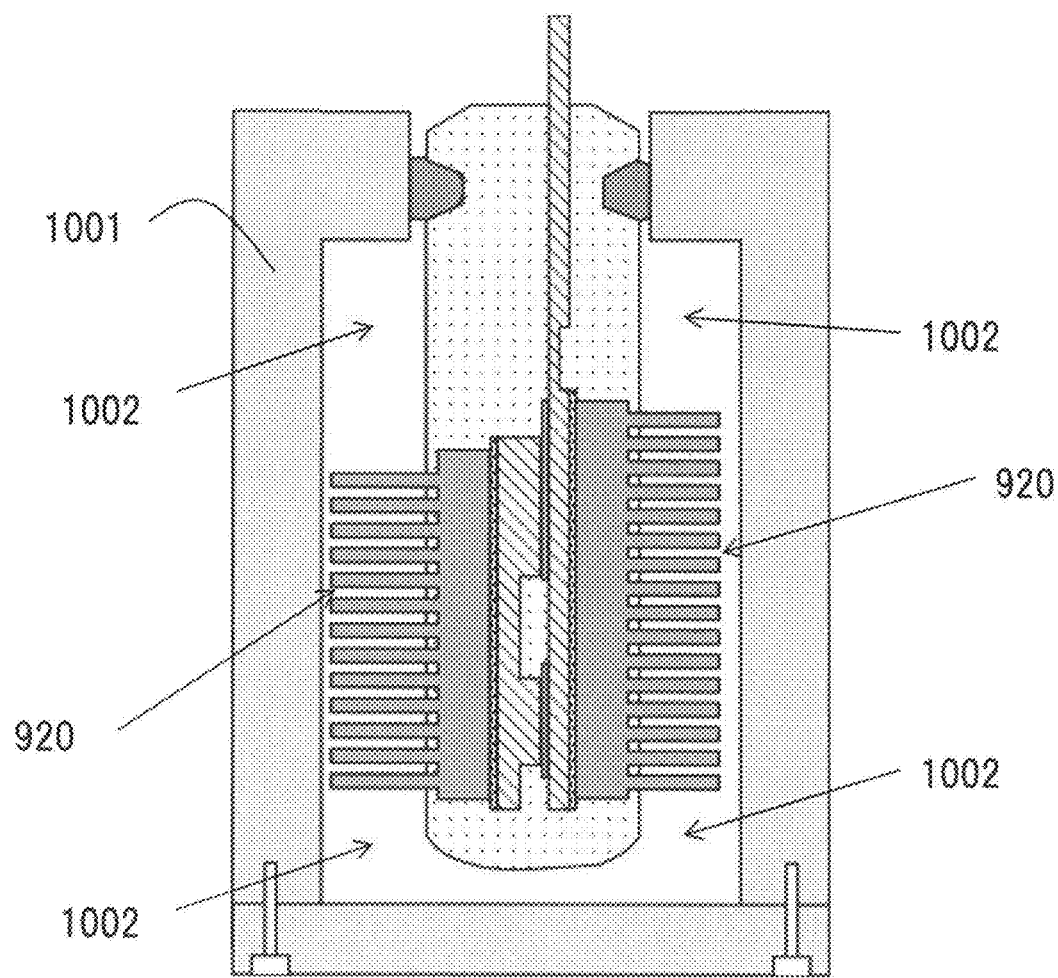
FIG. 21 is a sectional view of a power conversion device of a comparative example.

FIG. 21 illustrates a schematic view of a power conversion device according to a comparative example. Since a fin portion 920 protrudes, a cooling medium flows not only into the vicinity of the fin portion 920 but also into upper and lower gaps, and a bypass flow 1002 is generated. With such a configuration, the flow rate of the fin portion having a narrow gap is greatly reduced as compared with the region where the bypass flow flows, and the heat dissipation is poor.

REFERENCE SIGNS LIST 10 upper case
12 housing
13 cooling water inlet
14 cooling water outlet
16 lower case
18 AC terminal
19 channel
20 waterway structure
21 connector
43 inverter circuit
136 battery
140 inverter circuit
142 inverter circuit
155 upper arm IGBT
156 upper arm diode
157 lower arm IGBT
158 lower arm diode
174 driver circuit
192 motor generator
194 motor generator
200 power conversion device
300 power semiconductor device
315B DC terminal (positive electrode)
319B DC terminal (negative electrode)
320B AC terminal
325U signal terminal
325L signal terminal
500 capacitor module
501 laminated wiring board
510 lead frame
520 lead frame
530 Al wire
800 wall portion
800A wall portion
800B wall portion
800C tapered portion
900 sealing resin
900A resin sealed region
900B resin sealed region
901 sealing portion
902 Al base plate
911 Al wiring
912 tie bar
920 fin portion
930 collector-side ceramic board
931 emitter-side ceramic board
940 emitter-side board assembly
941 nickel plating
942 ceramic insulator
950 collector-side board assembly
955 board assembly
960 transfer molding mold
961 transfer molding mold
965 plunger
1000 channel forming body
1001 waterway wall
1002 bypass flow
1200 plate

The invention claimed is:
1. A structure comprising:
a ceramic board;
a heat dissipation plate thermally connected to a heating element; and
a resin region having a resin material that immobilizes the heating element and the heat dissipation plate, wherein the heat dissipation plate includes
a fin portion including a plurality of fins protruding from a heat dissipation surface of the heat dissipation plate and formed to be exposed from the sealing resin material,
a wall portion that directly contacts the resin material and that is formed to protrude from the heat dissipation surface to a same side as the fin and which separates the fin portion and the resin region,
the ceramic board consists of an Al base plate, a ceramic insulator, and Al wiring, and
the Al wiring, the Al base, the fin portion, the wall portion, and a tapered surface are integrally formed by molten metal in which molten Al is poured into a mold.
2. The structure according to claim 1, wherein
the wall portion has a first region and a second region in a periphery of the fin portion, and
the first region is formed to be smaller than the second region in protruding height.
3. The structure according to claim 2, wherein
the first region is formed to be smaller than the fin in the protruding height.
4. The structure according to claim 1, wherein
the wall portion has a deformed portion formed along a boundary between the wall portion exposed from the sealing resin material and the resin region.
5. The structure according to claim 2, wherein
the resin region has a step between a surface in contact with the first region and a surface in contact with the second region.
6. The structure according to claim 2, wherein
the wall portion has a tapered portion connecting a surface of the first region and a surface of the second region in a boundary portion between the first region and the second region.
7. The structure according to claim 1, wherein
a tip of the fin is formed on a same plane as an end of the wall portion.
8. The structure according to claim 1, wherein
the heating element is a power semiconductor device that converts direct current power into alternating current power by a switching operation,
a current terminal electrically connected with the power semiconductor device and which transmits a current is provided, and
the current terminal protrudes from the resin region.
9. The structure according to claim 1, wherein
the heat dissipation plate has a first base plate and a second base plate, and
the heating element is disposed between the first base plate and the second base plate.
10. An assembly comprising:
the structure according to claim 1; and
a waterway structure having flat wall surfaces into which the structure is inserted, wherein
a waterway in which a cooling medium is circulated is formed between the flat wall surface and the heat dissipation surface.
11. The structure according to claim 1, wherein
the plurality of fins have a first cross sectional shape, and the wall portion has a second cross sectional shape that is different than the first cross sectional shape.

* * * * *